United States Patent
Park et al.

(10) Patent No.: US 9,520,289 B2
(45) Date of Patent: Dec. 13, 2016

(54) METHODS OF FORMING A PATTERN OF A SEMICONDUCTOR DEVICE

(71) Applicant: SAMSUNG ELECTRONICS CO., LTD., Gyeonggi-do (KR)

(72) Inventors: Jin Park, Gyeonggi-do (KR); Cha-Won Koh, Gyeonggi-do (KR); Hyun-Woo Kim, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 63 days.

(21) Appl. No.: 14/519,813

(22) Filed: Oct. 21, 2014

(65) Prior Publication Data
US 2015/0243520 A1 Aug. 27, 2015

(30) Foreign Application Priority Data
Feb. 25, 2014 (KR) ................... 10-2014-0021687

(51) Int. Cl.
| | |
|---|---|
| *G03F 7/38* | (2006.01) |
| *H01L 21/027* | (2006.01) |
| *G03F 7/26* | (2006.01) |
| *H01L 21/033* | (2006.01) |
| *H01L 21/3105* | (2006.01) |
| *H01L 21/02* | (2006.01) |

(52) U.S. Cl.
CPC ............. *H01L 21/0273* (2013.01); *G03F 7/26* (2013.01); *G03F 7/38* (2013.01); *H01L 21/0337* (2013.01); *H01L 21/31058* (2013.01); *H01L 21/02164* (2013.01); *H01L 21/02277* (2013.01)

(58) Field of Classification Search
CPC ........................................................ G03F 7/26
See application file for complete search history.

(56) References Cited

U.S. PATENT DOCUMENTS

| 7,723,235 B2 | 5/2010 | Kurihara et al. |
|---|---|---|
| 8,415,000 B2 | 4/2013 | Stowers et al. |
| 8,460,569 B2 | 6/2013 | Godet et al. |
| 8,513,132 B2 | 8/2013 | Ku |

(Continued)

FOREIGN PATENT DOCUMENTS

| KR | 1020070021309 | 2/2007 |
|---|---|---|
| KR | 1020090065475 | 6/2009 |

(Continued)

*Primary Examiner* — Kathleen Duda
(74) *Attorney, Agent, or Firm* — F. Chau & Associates, LLC

(57) ABSTRACT

In a method of forming a pattern of a semiconductor device, a hard mask layer is formed on a substrate. A photoresist film is coated on the hard mask layer. The photoresist film is exposed and developed to form a first photoresist pattern. A smoothing process is performed on the first photoresist pattern to form a second photoresist pattern having a roughness property lower from that of the first photoresist pattern. In the smoothing process, a surface of the first photoresist pattern is treated with an organic solvent. An ALD layer is formed on a surface of the second photoresist pattern. The ALD layer is anisotropically etched to form an ALD layer pattern on a sidewall of the second photoresist pattern. The hard mask layer is etched using the second photoresist pattern and the ALD layer pattern as an etching mask to form a hard mask pattern.

19 Claims, 9 Drawing Sheets

(56) References Cited

U.S. PATENT DOCUMENTS

| | | | |
|---|---|---|---|
| 8,513,135 | B2 | 8/2013 | Greeley et al. |
| 8,603,728 | B2 | 12/2013 | Prokopowicz et al. |
| 2010/0055400 | A1 | 3/2010 | Farr et al. |
| 2011/0316114 | A1* | 12/2011 | Niroomand ......... H01L 21/0338 257/499 |
| 2012/0064463 | A1 | 3/2012 | Park et al. |
| 2012/0139086 | A1 | 6/2012 | Kim et al. |
| 2012/0156879 | A1 | 6/2012 | Kozawa et al. |
| 2012/0223418 | A1 | 9/2012 | Stowers et al. |
| 2012/0318773 | A1 | 12/2012 | Wu et al. |
| 2013/0040246 | A1 | 2/2013 | Kawakami |
| 2013/0164657 | A1 | 6/2013 | Altamirano Sanchez |
| 2013/0171571 | A1 | 7/2013 | Dunn et al. |
| 2013/0267097 | A1 | 10/2013 | Srivastava et al. |
| 2013/0312659 | A1* | 11/2013 | Inatomi .................... G03F 7/40 118/66 |

FOREIGN PATENT DOCUMENTS

| | | |
|---|---|---|
| KR | 1020100039886 | 4/2010 |
| KR | 1020110003033 | 1/2011 |
| KR | 1020110052723 | 5/2011 |
| KR | 1020110132288 | 12/2011 |
| KR | 1020120026314 | 3/2012 |
| KR | 1020120061209 | 6/2012 |
| KR | 1020120067927 | 6/2012 |
| KR | 1020120120729 | 11/2012 |
| KR | 1020120132666 | 12/2012 |
| KR | 1020130039307 | 4/2013 |

\* cited by examiner

METHODS OF FORMING A PATTERN OF A SEMICONDUCTOR DEVICE

CROSS-REFERENCE TO RELATED APPLICATION

This application claims priority under 35 USC §119 to Korean Patent Application No. 10-2014-0021687, filed on Feb. 25, 2014 in the Korean Intellectual Property Office (KIPO), the disclosure of which is incorporated by reference herein in its entirety.

TECHNICAL FIELD

Exemplary embodiments of the present inventive concept relate to a semiconductor device, and more particularly to methods of forming a pattern of a semiconductor device.

DISCUSSION OF RELATED ART

In integrated semiconductor devices, a minute pattern having a critical dimension of about tens of nanometers (nm) may be formed by a photolithography process. A wavelength of light used in the photolithography process may be relatively small. For example, extreme ultraviolet (EUV) light may be used as a light source in the photolithography process. An electron beam may also be used to form minute patterns as part of an electron-beam lithography process.

SUMMARY

Exemplary embodiments of the present inventive concept provide a method of forming a minute pattern of a semiconductor device.

According to exemplary embodiments of the present inventive concept, a method of forming a pattern of a semiconductor device includes forming a hard mask layer on a substrate. A photoresist film is coated on the hard mask layer. The photoresist film is exposed and developed to form a first photoresist pattern. A smoothing process is performed on the first photoresist pattern to form a second photoresist pattern having a roughness property lower than that of the first photoresist pattern. A surface of the first photoresist pattern is treated with an organic solvent during the smoothing process. An atomic layer deposition (ALD) layer is formed on a surface of the second photoresist pattern. The ALD layer is anisotropically etched to form an ALD layer pattern on a sidewall of the second photoresist pattern. The hard mask layer is etched using the second photoresist pattern and the ALD layer pattern as an etching mask to form a hard mask pattern.

In exemplary embodiments of the present inventive concept, the organic solvent may include ethyl lactate, cyclohexanone, dimethylsulfoxide, γ-butyrolactone, or n-methylpyrrolidone.

In exemplary embodiments of the present inventive concept, the smoothing process may include heating the substrate having the first photoresist pattern thereon to a temperature of about 80° C. to about 120° C. A vaporized organic solvent may be sprayed onto the first photoresist pattern.

In exemplary embodiments of the present inventive concept, the first photoresist pattern may be formed to include a plurality of lines and a plurality of spaces that are alternately and repeatedly arranged.

In exemplary embodiments of the present inventive concept, the first photoresist pattern may include a plurality of photoresist patterns. A width between each of the plurality of photoresist patterns may be in a range of about 20 nm to about 50 nm.

In exemplary embodiments of the present inventive concept, the first photoresist pattern may be formed to include a plurality holes. The holes may be evenly spaced in the first photoresist pattern.

In exemplary embodiments of the present inventive concept, the ALD layer may include silicon oxide or silicon nitride.

In exemplary embodiments of the present inventive concept, forming the ALD layer may include introducing a source gas including silicon onto the substrate to be chemisorbed onto the second photoresist pattern. A non-chemisorbed source gas may be purged. A reactant including oxygen may be introduced onto the substrate to oxidize the chemisorbed source gas to form the ALD layer including silicon oxide. An unreacted gas may be purged.

In exemplary embodiments of the present inventive concept, the steps recited above may be performed repeatedly, and a thickness of the ALD layer may be controlled by the number of repetitions of steps recited above.

In exemplary embodiments of the present inventive concept, the ALD layer may be formed to have a thickness of about 0.1 nm to about 5 nm.

In exemplary embodiments of the present inventive concept, the ALD layer may be formed at a temperature of about 0° C. to about 120° C.

In exemplary embodiments of the present inventive concept, an underlying layer may be formed on the hard mask layer. The photoresist film may be formed on the underlying layer.

In exemplary embodiments of the present inventive concept, the photoresist film may be exposed using extreme ultraviolet (EUV) light.

In exemplary embodiments of the present inventive concept, etching the hard mask layer may include an anisotropic etching process.

In exemplary embodiments of the present inventive concept, a baking processes may be performed. The baking processes may include a soft bake process after coating the photoresist film on the hard mask layer, a post-exposure bake process after exposing the photoresist film, and a post-development bake process after developing the photoresist film.

According to exemplary embodiments of the present inventive concept, a minute pattern of a highly integrated semiconductor device, which may have reduced roughness, may be formed.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EMBODIMENTS

Figure 1:
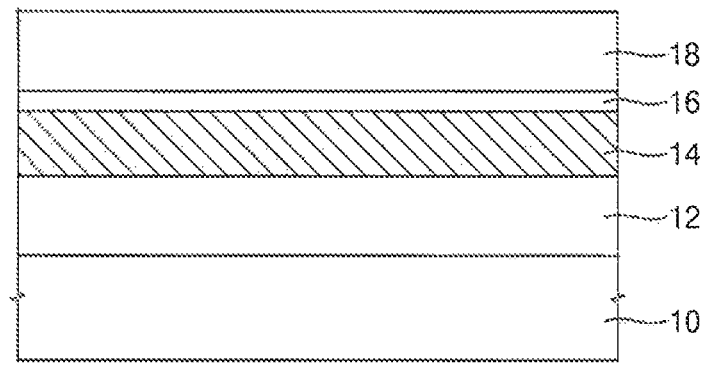
FIGS. 1 to 8 are cross-sectional views illustrating stages of a method of forming a pattern of a semiconductor device in accordance with exemplary embodiments of the present inventive concept.

Various exemplary embodiments of the present inventive concept will be described more fully hereinafter with reference to the accompanying drawings, in which some exemplary embodiments are shown. The present inventive concept may, however, be embodied in many different forms and should not be construed as limited to the exemplary embodiments set forth herein.

Like reference numerals may refer to like elements throughout the specification and drawings.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Exemplary embodiments of the present inventive concept are described herein with reference to cross-sectional illustrations that may be schematic illustrations of idealized examples (and intermediate structures). As such, variations from the shapes of the illustrations as a result, for example, of manufacturing techniques and/or tolerances, may occur. Exemplary embodiments of the present inventive concept should not be construed as limited to the particular shapes of regions illustrated herein but are to include deviations in shapes that result, for example, from manufacturing.

FIGS. 1 to 8 are cross-sectional views illustrating stages of a method of forming a pattern of a semiconductor device in accordance with exemplary embodiments of the present inventive concept, and FIGS. 9 to 12 are plan views illustrating the stages of the method of forming the pattern of the semiconductor device.

In exemplary embodiments of the present inventive concept, the pattern may include a plurality of lines and a plurality of spaces that may be alternately and repeatedly formed in a particular direction.

Referring to FIG. 1, an etch target layer 12 may be formed on a substrate 10. When the substrate 10 is etched, the etch target layer 12 need not be formed on the substrate 10.

A hard mask layer 14 may be formed on the etch target layer 12. The hard mask layer 14 may include a material for serving as an etching mask for the etch target layer 12. Thus, the hard mask layer 14 may include the material that may be chosen according to the etch target layer 12. For example, the hard mask layer 14 may include silicon nitride or silicon oxynitride. The hard mask layer 14 may include silicon oxide.

An underlying layer 16 may be formed on the hard mask layer 14. A first photoresist film 18 may be coated on the underlying layer 16.

The underlying layer 16 may be formed between the hard mask layer 14 and the first photoresist film 18, so that an adhesion property of the first photoresist film 18 may be increased. The underlying layer 16 may include a material that may be chemically cross-linked with the first photoresist film 18. The underlying layer 16 need not be formed on the hard mask layer 14. An anti-reflective layer (not shown) may be formed on the underlying layer 16.

After coating the first photoresist film 18, a soft bake process may be performed. For example, the soft bake process may be performed at a temperature of about 80° C. to about 120° C. During the soft bake process, the underlying layer 16 may be chemically cross-linked with the first photoresist film 18 so that the underlying layer 16 and the first photoresist film 18 may be bonded to each other and the first photoresist film 18 may be hardened.

Figure 2:
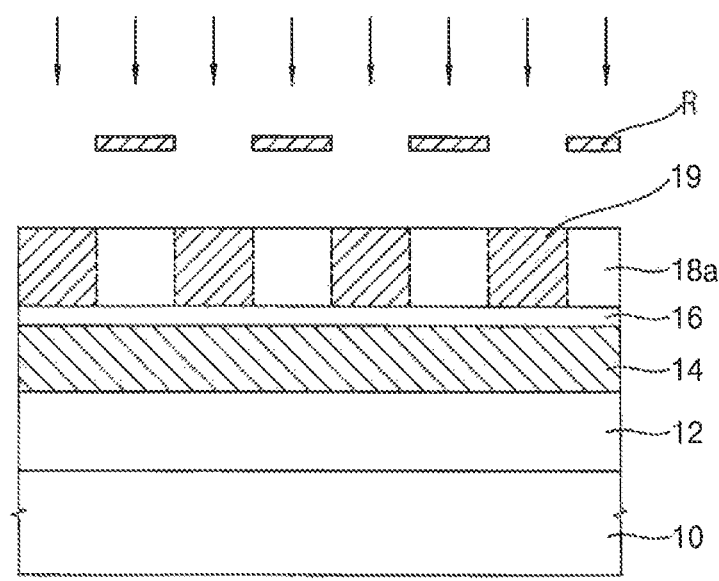
Figure 9:
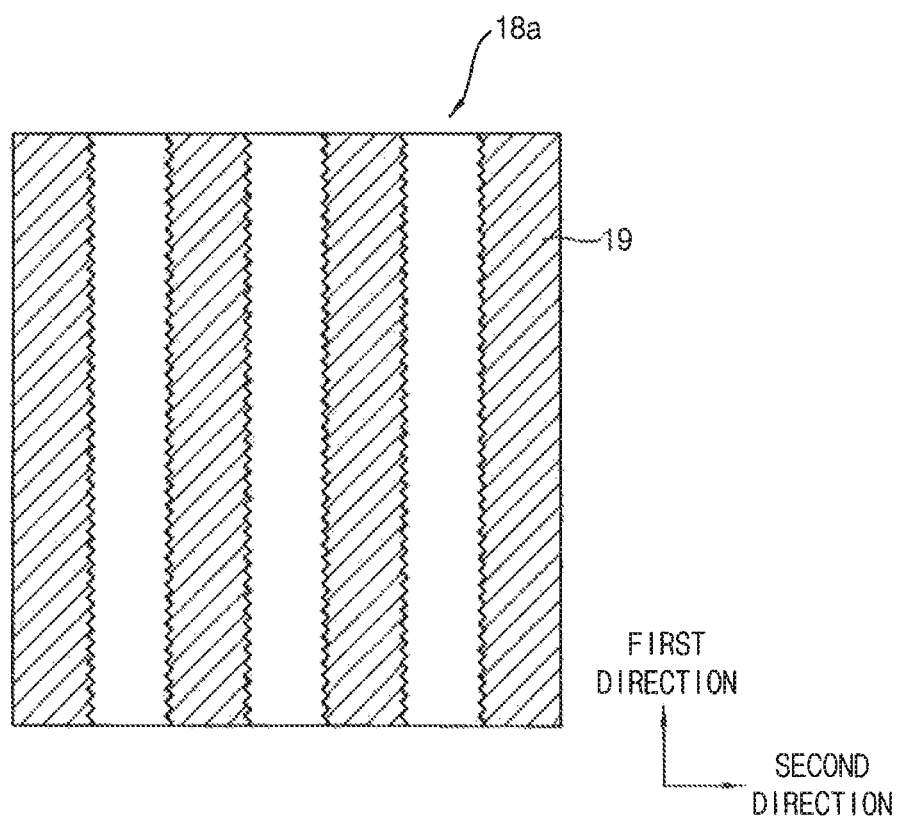
FIGS. 9 to 12 are plan views illustrating the stages of the method of forming the pattern of the semiconductor device.

Referring to FIGS. 2 and 9, the first photoresist film 18 may be exposed to light through a reticle R, and an exposed portion 19 of the first photoresist film 18 may become soluble to a developer. By the exposure process, the first photoresist film 18 may be transformed into a second photoresist film 18a having the exposed portion 19. In exemplary embodiments of the present inventive concept, the exposed portion 19 may have a linear shape extending in a first direction and a plurality of exposed portions 19 may be formed in a second direction substantially perpendicular to the first direction, so that a pattern having lines and spaces arranged in the second direction may be formed.

Light used in the exposure process may include extreme ultraviolet (EUV) light. EUV light may have a wavelength of about 13.5 nm. When EUV light is used in a photolithography process, a minute pattern having a critical dimension of about 20 nm to about 50 nm may be formed. A minute pattern including lines and spaces and having a critical dimension of less than about 30 nm may be formed by the photolithography process using EUV light.

In exemplary embodiments of the present inventive concept, light used in the exposure process may be changed according to the critical dimension of the lines and spaces of the pattern. For example, when the lines and spaces of the pattern have the critical dimension greater than about 50 nm, the pattern may be formed by using light having a wavelength longer than that of the EUV light being used. For example, light used in the exposure process may be produced using G-line, I-line, KrF excimer laser or ArF excimer laser.

After the exposure process, a post-exposure bake process may be performed. For example, the post-exposure bake process may be performed at a temperature of about 80° C. to about 120° C. for about 30 seconds to about 100 seconds.

Figure 3:
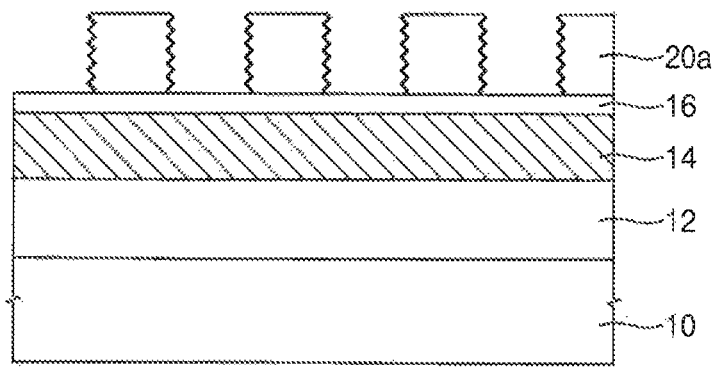
Figure 10:
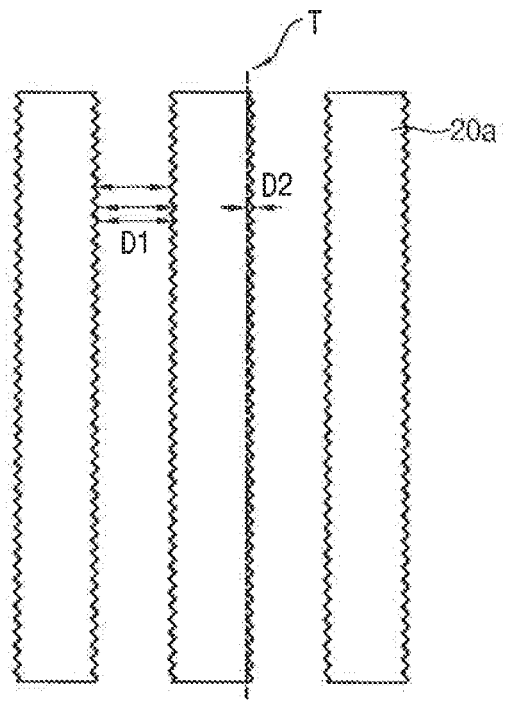

Referring to FIGS. 3 and 10, the second photoresist film 18a may be developed to form a first photoresist pattern 20a. In exemplary embodiments of the present inventive concept, the exposed portion 19 of the second photoresist film 18a may become soluble to the developer, so that the second photoresist film 18a may be transformed into the first photoresist pattern 20a. After the developing process, a post-development bake process may be performed. For example, the post-development bake process may be performed at a temperature of about 80° C. to about 150° C.

In exemplary embodiments of the present inventive concept, the first photoresist pattern 20a may extend in the first direction, and a plurality of first photoresist patterns 20a may be formed in the second direction. Thus, a plurality of lines and a plurality of spaces, each of which may extend in the first direction, may be arranged the second direction.

A sidewall or an edge of the exposed portion 19 of the second photoresist film 18a need not be uniform in the first direction, and thus the sidewall or the edge of the first photoresist pattern 20a in the second direction may be relatively rough in the first direction.

In FIG. 10, the edge of the first photoresist pattern 20a in the second direction may have an uneven surface in the first direction, and thus a first distance D1 between edges of neighboring first photoresist patterns 20a need not be constant in the first direction. A variation of the first distance D1 may be referred to as a line width roughness (LWR). When the LWR is high, the edge of the first photoresist pattern 20a may have an uneven surface in the first direction and may be relatively rough.

The edge of the first photoresist pattern 20a need not be formed at a desired position along a reference straight line T. A variation of a second distance D2 between the edge of the first photoresist pattern 20a and the reference straight line T may be referred to as a line edge roughness (LER). When the LER is high, the edge of the first photoresist pattern 20a may have an uneven surface in the first direction and need not have a straight line shape.

When the minute pattern having the critical dimension of about 20 nm to about 50 nm is formed by the photolithography process using EUV light, the minute pattern may be relatively rough. The uniformity of the minute pattern may vary according to the LWR because the minute pattern may have a small critical dimension.

Figure 4:
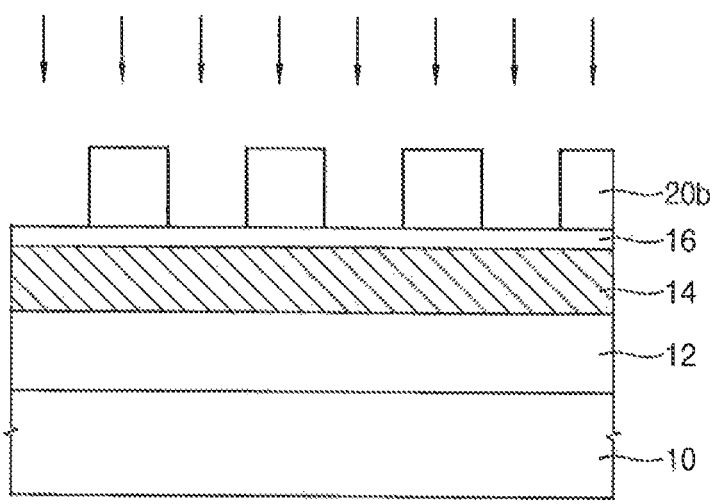
Figure 11:
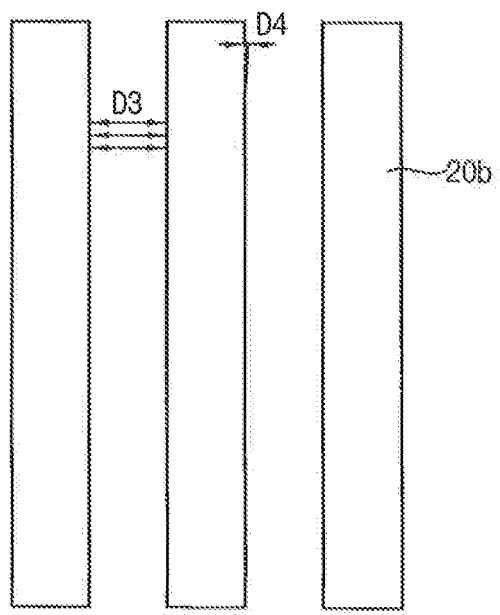

Referring to FIGS. 4 and 11, a smoothing process in which a surface of the first photoresist pattern 20a may be treated with an organic solvent may be performed to form a second photoresist pattern 20b which is less rough than the first photoresist pattern 20a. Edges of the second photoresist patterns 20b may be spaced apart from each other by a third distance D3 in the second direction, and the edge of the second photoresist pattern 20b and the reference straight line T may be spaced apart from each other at a fourth distance D4, which is smaller than the second distance D2 in the second direction. The second photoresist pattern 20b may have a lower LWR and a lower LER than the first photoresist pattern 20a.

In the smoothing process, the substrate 10 having the first photoresist patterns 20a thereon may be heated to a temperature of about 80° C. to about 120° C., and an organic solvent vapor may be sprayed onto the first photoresist patterns 20a. The organic solvent may be heated to be vaporized, and thus rough surfaces of the first photoresist patterns 20a may be removed by the organic solvent vapor, so that the surfaces of the first photoresist patterns 20a may be smoothed. In exemplary embodiments of the present inventive concept, the smoothing process may be performed for about 60 seconds to about 200 seconds.

The organic solvent used in the smoothing process may include, for example, ethyl lactate, cyclohexanone, dimethylsulfoxide, γ-butyrolactone, or n-methylpyrrolidone (NMP). When NMP is used as the organic solvent, the NMP may be heated to a temperature of about 50° C. to about 70° C. A composition of the organic solvent may increase the effectiveness of the smoothing process.

Figure 5:
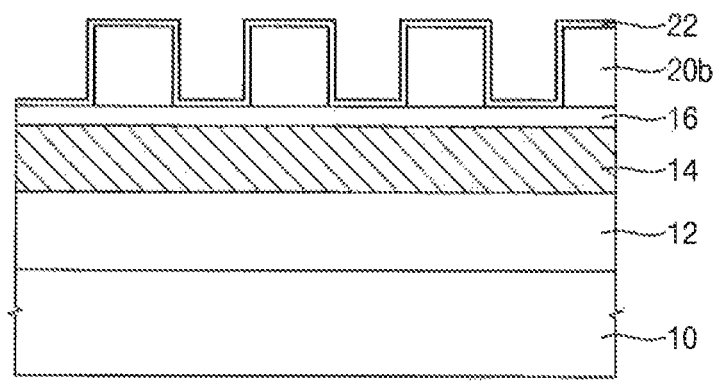

Referring to FIG. 5, an atomic layer deposition (ALD) layer 22 may be conformally formed on the second photoresist patterns 20b and the underlying layer 16. The ALD layer 22 may be formed by an ALD process.

When a thickness of the ALD layer 22 is less than about 0.1 nm, surfaces of the second photoresist patterns 20b might not be sufficiently hardened. If the thickness of the ALD layer 22 is more than about 5 nm, a width of a hard mask pattern 14a (refer to FIG. 7) subsequently formed may be too large. Thus, the thickness of the ALD layer 22 may be in a range of about 0.1 nm to about 5 nm.

The ALD layer 22 may be formed by an ALD process in which a plurality of atomic layers may be formed, and may have a uniform thickness in a range of about 0.1 nm to about 5 nm. The ALD layer 22 may include silicon oxide or silicon nitride.

If the ALD layer 22 may be formed at a relatively high temperature, for example at a temperature higher than about 150° C. and a structure of the second photoresist pattern 20b may be transformed. The ALD layer 22 may be formed at a temperature lower than about 150° C., for example, at a temperature of about 0° C. to about 120° C.

When the ALD layer 22 includes silicon oxide, the ALD layer 22 may be formed by the following exemplary processes. A source gas including silicon may be introduced onto the substrate 10, and the source gas may be chemisorbed onto surfaces of the second photoresist patterns 20b and the underlying layer 16. A non-chemisorbed source gas may be purged. Then, a reactant including oxygen may be introduced onto the substrate 10, and thus the chemisorbed source gas may be oxidized to form the ALD layer 22 including silicon oxide. Unreacted gas may be purged. The above steps may define one exemplary process cycle, and the ALD layer 22 including silicon oxide may be formed to have a desired thickness by performing a plurality of process cycles.

The source gas may include, for example, $SiH_4$, $Si_2H_6$, $Si_3HR$, tetraethyl orthosilicate (TEOS), dichlorodisilane ($SiH_2Cl_2$, DCS), hexachlorodisilane (HCD), or tri-silylamine (TSA). The reactant may include, for example, $O_2$, $N_2O$, $O_3$, $H_2O$, or $H_2O_2$.

Figure 6:
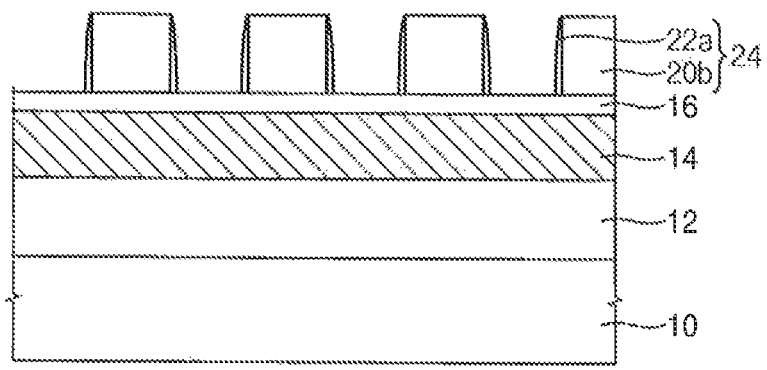
Figure 12:
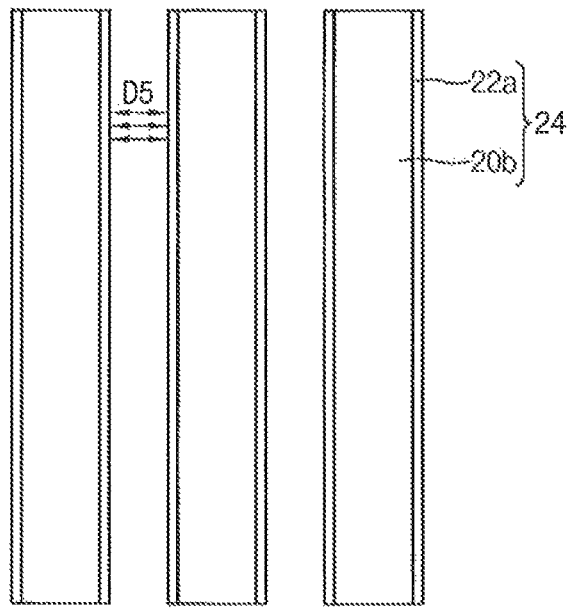

Referring to FIGS. 6 and 12, the ALD layer 22 may be anisotropically etched, and portions of the ALD layer 22 on the second photoresist patterns 20b and on the underlying layer 16 between the second photoresist patterns 20b may be removed. Thus, an ALD layer pattern 22a may be formed on a sidewall of each of the second photoresist patterns 20b.

The second photoresist pattern 20b and the ALD) layer pattern 22a may serve as an etching mask pattern 24 for forming the hard mask pattern 14a.

Edges of the etching mask patterns 24 may be spaced apart from each other by a fifth distance D5 in the second direction, and the etching mask pattern 24 may have an LWR and an LER substantially the same as or less than those of the second photoresist pattern 20b. The etching mask pattern 24 may have an LWR and an LER that is less than those of the first photoresist pattern 20a.

The second photoresist pattern 20b may have relatively low roughness. However, a surface of the second photoresist pattern 20b may have a relatively weak bonding structure, and might not have strength to endure an etching process when the second photoresist pattern 20b has been treated by the organic solvent. When the etching process is performed using only the second photoresist pattern 20b as an etching mask, the relatively low roughness of the second photoresist pattern 20b might not be transferred into the hard mask layer pattern 14a (refer to FIG. 7). Thus, even when the second photoresist pattern 20b is used as an etching mask, the hard mask pattern 14a subsequently formed may have relatively high roughness.

In an exemplary embodiment of the present inventive concept, the ALD layer 22 may be formed on the second photoresist pattern 20b so that the surface of the etching mask pattern 24 may be hardened. Thus, a sidewall of the etching mask pattern 24 need not be deformed during an etching process.

Figure 7:
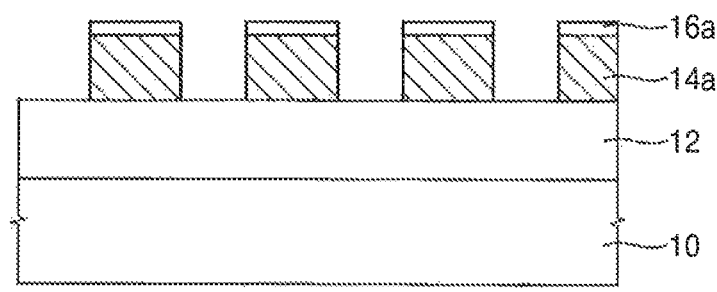

Referring to FIG. 7, the underlying layer 16 and the hard mask layer 14 may be anisotropically etched using the etching mask pattern 24 to form an underlying layer pattern 16a and the hard mask pattern 14a, respectively.

A shape of the etching mask pattern 24 may be transferred to the underlying layer 16 and hard mask layer 14, and the underlying layer pattern 16a and hard mask pattern 14a may be formed. The etching mask pattern 24 may have relatively low roughness and may have a hardened surface, and the hard mask pattern 14a may also have relatively low roughness. A sidewall of the hard mask pattern 14a may have a vertical profile and an edge of the hard mask pattern 14a may have a straight line shape. The hard mask pattern 14a may have an LWR and an LER that is lower than those of the first and second photoresist patterns 20a and 20b.

The second photoresist patterns 20b and the ALD layer 22 on the underlying layer pattern 16a may be removed.

Figure 8:
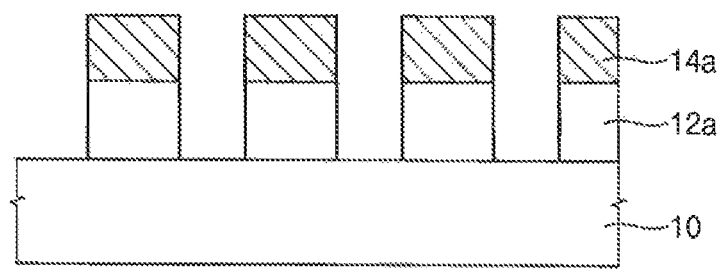

Referring to FIG. 8, after removing the underlying layer pattern 16a, the etch target layer 12 may be etched using the hard mask pattern 14a as an etching mask to form a pattern 12a.

In an exemplary embodiment of the present inventive concept, the etching mask pattern 24 may be formed to have relatively low roughness and a relatively high surface strength by a photolithography process using EUV light. Thus, the hard mask pattern 14a may be formed to have relatively low roughness and the pattern 12a having the critical dimension of less than about 30 nm may be formed to have relatively low roughness.

FIGS. 13 to 17 are plan views illustrating stages of a method of forming a pattern of a semiconductor device in accordance with exemplary embodiments of the present inventive concept.

In exemplary embodiments of the present inventive concept, the pattern may include a plurality of holes. FIGS. 13, 14, 15, 16 and 17 are cross-sectional views showing the patterns of the semiconductor device similar to those illustrated in FIGS. 2, 3, 4, 6 and 8, respectively.

With reference to the semiconductor device illustrated in FIGS. 13, 14, 15, 16 and 17, a process substantially the same as or similar to that illustrated with reference to FIG. 1 may be performed to form the etch target layer 12, the hard mask layer 14, the underlying layer 16 and the first photoresist film 18 on the substrate 10.

Figure 13:
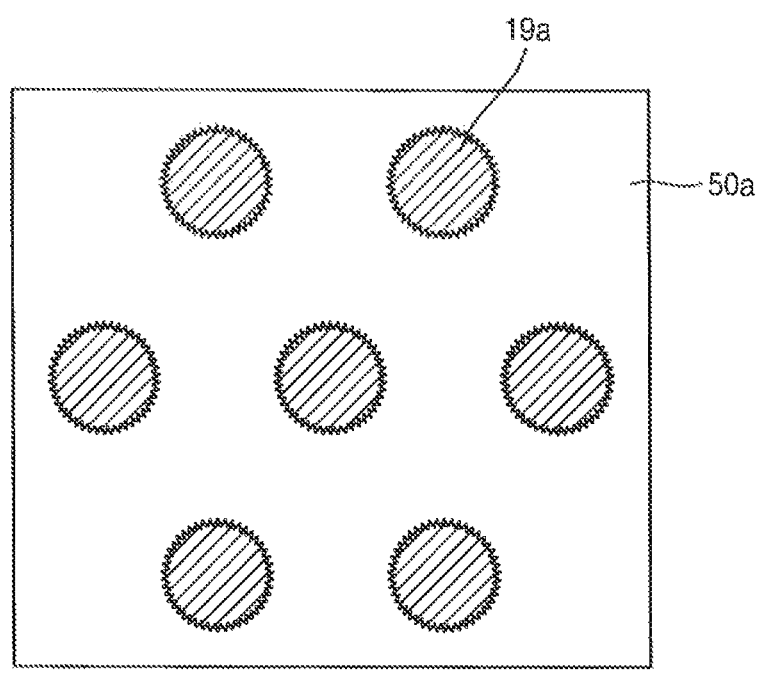
FIGS. 13 to 17 are plan views illustrating stages of a method of forming a pattern of a semiconductor device in accordance with exemplary embodiments of the present inventive concept.

Referring to FIG. 13, the first photoresist film 18 may be exposed to light through the reticle R, and an exposed portion 19a of the first photoresist film 18 may be rendered soluble by the developer. By the exposure process, the first photoresist film 18 may be transformed into a second photoresist film 50a having a plurality of exposed portions 19a. In exemplary embodiments of the present inventive concept, the exposed portion 19a may have a circular shape when viewed from a top side, and a pattern having a circular hole may be formed.

After the exposure process, the post-exposure bake process may be performed. For example, the post-exposure bake process may be performed at a temperature of about 80° to about 120° for about 30 seconds to about 100 seconds.

Figure 14:
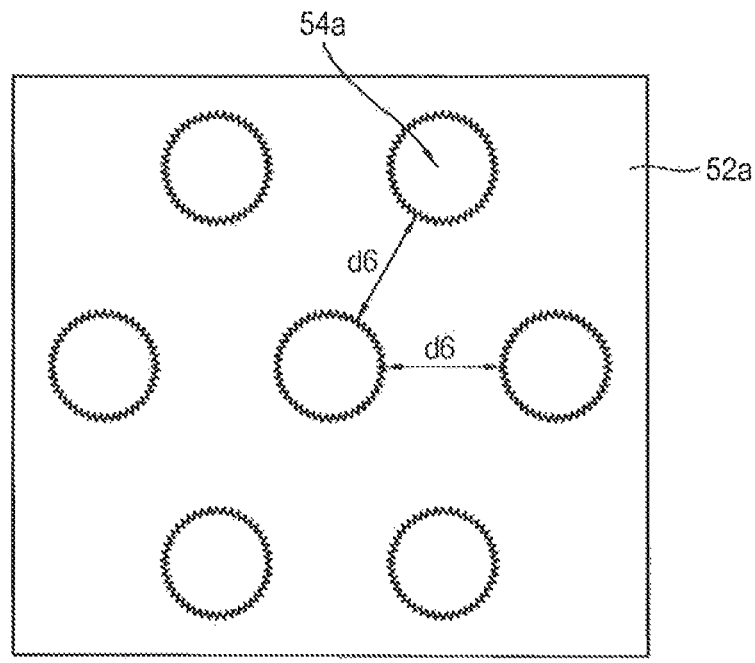

Referring to FIG. 14, the second photoresist film 50a may be developed to form a first photoresist pattern 52a having a plurality of first holes 54a. The first holes 54a may be regularly arranged in the photoresist pattern 52a.

After the developing process, the post-development bake process may be performed. For example, the post-development bake process may be performed at a temperature of about 80° C. to about 150° C.

In exemplary embodiments of the present inventive concept, an edge of each of the first holes 54a might not have a circular shape, and the first holes 54a may have relatively high roughness. Thus, a first distance D6 between edges of neighboring first holes 54a might not be uniform. When minute holes are formed by the photolithography process using EUV light, the minute holes may be relatively rough.

Figure 15:
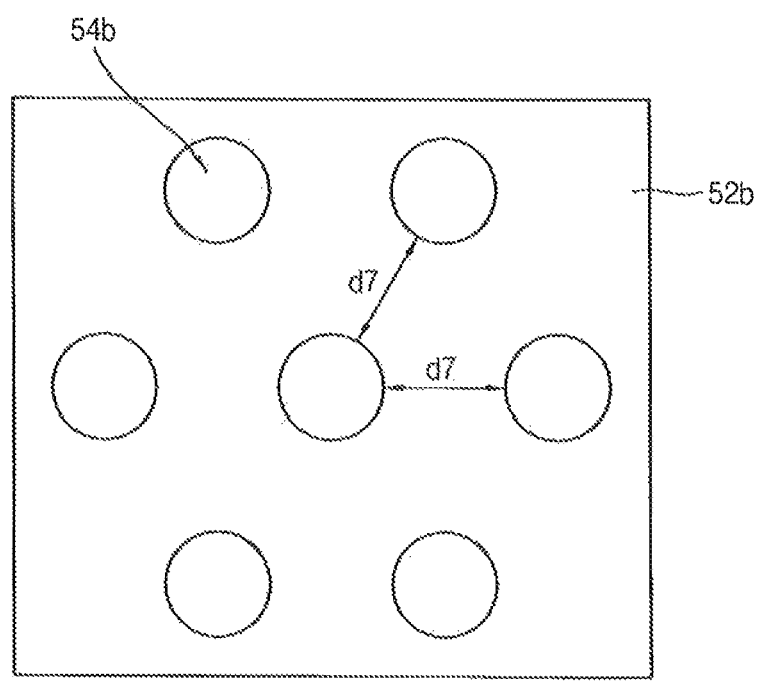

Referring to FIG. 15, the smoothing process in which sidewalls of the first holes 54a of the first photoresist pattern 52a may be treated with the organic solvent may be performed to form the second photoresist pattern 52b having a plurality of second holes 54b.

The smoothing process may be substantially the same as or similar to that illustrated with reference to FIG. 4. For example, in the smoothing process, the organic solvent vapor may be sprayed onto the first photoresist patterns 52a. The organic solvent used in the smoothing process may include, for example, ethyl lactate, cyclohexanone, dimethylsulfoxide, γ-butyrolactone, or n-methylpyrrolidone (NMP).

Sidewalls of the first holes 54a having relatively rough surfaces may be smoothed by the smoothing process, so that the first holes 54a may be transformed into the second holes 54b having relatively low roughness compared to the roughness of the first holes 54a. Thus, a second distance D7 between edges of neighboring second holes 54b may be more uniform than the first distance D6.

Figure 16:
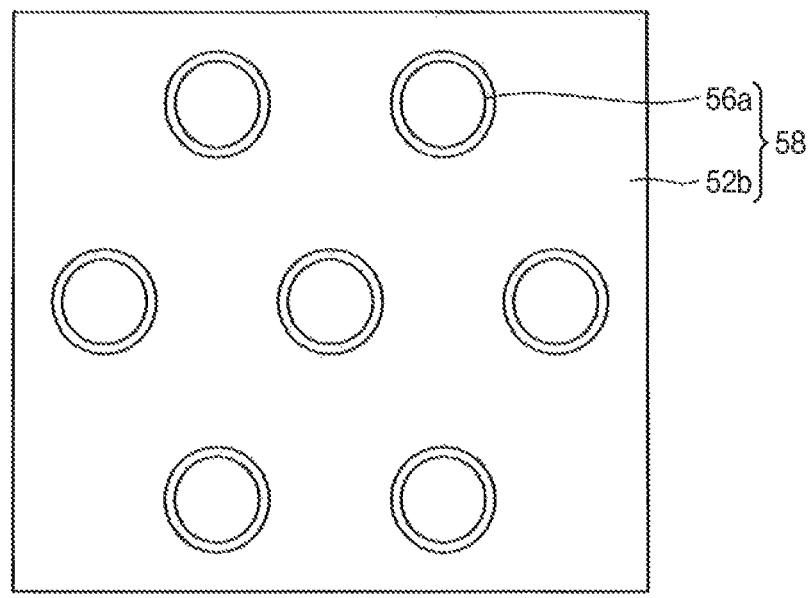

Referring to FIG. 16, the ALD layer may be conformally formed on the sidewalls of the second holes 54b and an upper surface of the second photoresist pattern 52b, and a surface of the second photoresist pattern 52b may be hardened.

If the thickness of the ALD layer is less than about 0.1 nm, a surface of the second photoresist pattern 52b might not be sufficiently hardened. If the thickness of the ALD layer is more than about 5 nm, widths of a plurality of third holes 60 subsequently formed in a hard mask pattern 62 (refer to FIG. 17) may be too small. Thus, the thickness of the ALD layer may be in a range of about 0.1 nm to about 5 nm. The ALD layer may include silicon oxide or silicon nitride.

The ALD layer may be anisotropically etched, so that portions of the ALD layer on the second photoresist pattern 52b and on the underlying layer 16 exposed by the second holes 54b may be removed. Thus, an ALD layer pattern 56a may be formed on sidewalls of the second holes 54b.

The second photoresist pattern 52b and the ALD layer pattern 56a may serve as an etching mask pattern 58 for forming the hard mask pattern 62.

Figure 17:
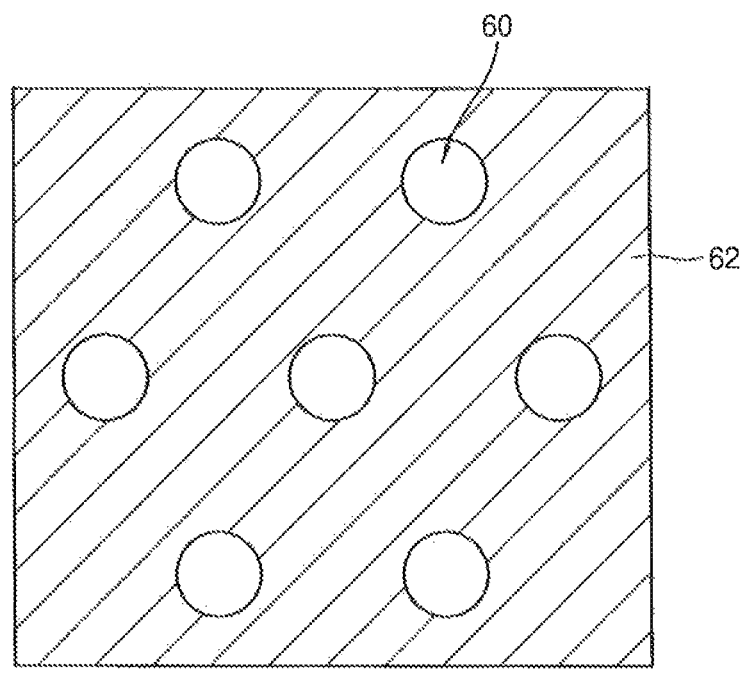

Referring to FIG. 17, the underlying layer 16 and the hard mask layer 14 may be anisotropically etched using the etching mask pattern 58 to form the underlying layer pattern (not shown) and the hard mask pattern 62 having the third holes 60. The underlying layer pattern may be removed, or may remain. The second holes 54b may be transformed into the third holes 60, respectively, and thus a distance between edges of neighboring third holes 60 may be substantially uniform.

The etch target layer 12 may be etched using the hard mask pattern 62 to form the pattern having holes.

By the above processes, the etching mask pattern 58 having holes may be formed to have relatively low roughness and relatively high surface strength by a photolithography process using EUV light. Thus, the hard mask pattern 62 may be formed to have relatively low roughness and a substantially uniform distance between neighboring holes, so that the holes having a diameter of less than about 30 nm may be formed using the hard mask pattern 62.

Example 1

Step 1

Forming a Photoresist Pattern

A hard mask layer and an underlying layer may be sequentially formed on a sample substrate. The hard mask layer may include silicon oxynitride. The hard mask layer may be formed by a chemical vapor deposition process. The underlying layer may be formed to have a thickness of about 10 nm.

A photoresist film may be coated on the underlying layer to have a thickness of about 60 nm. The photoresist film may include a photoresist material for being exposed to EUV light.

The photoresist film may be exposed to EUV light. In the exposure process, a reticle for forming lines and spaces having widths of about 30 nm may be used. After the exposure process, a post-exposure bake process may be performed. The post-exposure bake process may be performed at a temperature of about 100° C. The photoresist film may be developed to form a first photoresist pattern. Then, a post-development bake process may be performed at a temperature of about 140° C.

A critical dimension, an LWR and an LER of the first photoresist pattern may be measured.

Step 2

Smoothing

A smoothing process in which a surface of the first photoresist pattern is treated with an organic solvent may be performed. The organic solvent may include NMP. A sample substrate having the first photoresist pattern thereon may be heated to a temperature of about 100° C., and the smoothing process may be performed for about 120 seconds. Thus, the first photoresist pattern may be transformed into a second photoresist pattern.

A critical dimension, an LWR and an LER of the second photoresist pattern may be measured.

Step 3

Depositing an ALD Layer

A silicon oxide layer may be conformally formed on the second photoresist pattern and the underlying layer by an ALD process. The silicon oxide layer may be formed to have a thickness of about 3 nm. Thus, an etching mask pattern having the second photoresist pattern and the silicon oxide layer may be formed.

A critical dimension, an LWR and an LER of the etch mask pattern may be measured.

TABLE 1

|  | Critical dimension (nm) | LWR (nm) | LER (nm) |
|---|---|---|---|
| First photoresist pattern | 34.0 | 4.0 | 2.5 |
| Second photoresist pattern | 33.9 | 3.6 | 2.2 |
| Etching mask pattern | 37.7 | 3.5 | 2.0 |

As described Table 1, the etching mask pattern may have a lower LWR and a lower LER than those of the first and second photoresist patterns, respectively. The etching mask pattern, which may be formed by smoothing and depositing the ALD layer, may have relatively low roughness.

Example 2

A hard mask layer, an underlying layer and an etch mask pattern may be formed on a sample substrate by substantially the same process as illustrated in Steps 1 to 3 above.

A critical dimension, an LWR and an LER of the etching mask pattern may be measured.

Step 4

Forming a Hard Mask Pattern

The hard mask layer and the underlying layer may be anisotropically etched using the etching mask pattern to form a first hard mask pattern.

A critical dimension, an LWR and an LER of the first hard mask pattern may be measured.

Comparative Example 1

A hard mask layer, an underlying layer and a second photoresist pattern may be formed on a sample substrate by substantially the same process as illustrated in Steps 1 to 2 above.

A critical dimension, an LWR and an LER of the second photoresist pattern may be measured.

The hard mask layer and the underlying layer may be anisotropically etched using the second photoresist pattern as an etching mask to form a second hard mask pattern. Step 3 need not be performed.

A critical dimension, an LWR and an LER of the second hard mask pattern may be measured.

Comparative Example 2

A hard mask layer, an underlying layer and a first photoresist pattern may be formed on a sample substrate by substantially the same process as illustrated in Step 1 above.

A critical dimension, an LWR and an LER of the first photoresist pattern may be measured.

The hard mask layer and the underlying layer may be anisotropically etched using the first photoresist pattern as an etching mask to form a third hard mask pattern. Steps 2 and 3 need not be performed.

A critical dimension, an LWR and an LER of the third hard mask pattern may be measured.

TABLE 2

|  | Critical dimension (nm) | | LWR (nm) | | LER (nm) | |
|---|---|---|---|---|---|---|
|  | etching mask | hard mask | etching mask | hard mask | etching mask | hard mask |
| Example 2 | 36.63 | 34.34 | 3.31 | 2.80 | 2.45 | 2.14 |
| Comparative Example 1 | 33.10 | 33.89 | 3.57 | 2.99 | 2.25 | 2.28 |
| Comparative Example 2 | 32.12 | 31.84 | 3.89 | 3.14 | 2.46 | 2.29 |

As described Table 2, the etching mask pattern of Example 2 may have a lower LWR and a lower LER than those of the second photoresist patterns of Comparative Example 1 and first photoresist patterns of Comparative Example 2, respectively. The etching mask pattern, which may be formed by smoothing process and depositing the ALD layer, may have relatively low roughness.

The first hard mask pattern of Example 2 may be formed using the etching mask pattern in accordance with exemplary embodiments of the present inventive concept, and thus the first hard mask pattern may have a lower LWR and a lower LER than those of the second and third hard mask patterns of Comparative Examples 1 and 2, respectively. Thus, the first hard mask pattern has relatively low roughness.

As described above, the pattern having the minute critical dimension may be formed. The processes for forming the pattern may be used, for example, in forming a wiring structure or a contact plug in a highly integrated semiconductor device.

While the present inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A method of forming a pattern of a semiconductor device, the method comprising:
    forming a hard mask layer on a substrate;
    coating a photoresist film on the hard mask layer;
    exposing and developing the photoresist film to form a first photoresist pattern;
    performing a smoothing process on the first photoresist pattern to form a second photoresist pattern having a roughness property lower than that of the first photoresist pattern, wherein a surface of the first photoresist pattern is treated with an organic solvent during the smoothing process, and wherein the smoothing process includes heating the substrate having the first photoresist pattern thereon to a temperature of about 80° C. to about 120° C. and spraying a vaporized organic solvent onto the first photoresist pattern;
    forming an atomic layer deposition (ALD) layer on a surface of the second photoresist pattern;
    anisotropically etching the ALD layer to form an ALD layer pattern on a sidewall of the second photoresist pattern; and
    etching the hard mask layer using the second photoresist pattern and the ALD layer pattern as an etching mask to form a hard mask pattern.

2. The method of claim 1, wherein the organic solvent includes at ethyl lactate, cyclohexanone, dimethylsulfoxide, γ-butyrolactone, or n-methylpyrrolidone.

3. The method of claim 1, wherein the first photoresist pattern is formed to include a plurality of lines and a plurality of spaces that are alternately and repeatedly arranged.

4. The method of claim 1, wherein the first photoresist pattern includes a plurality of photoresist patterns, and
    wherein a width between each of the plurality of photoresist patterns are in a range of about 20 nm to about 50 nm.

5. The method of claim 1, wherein the first photoresist pattern is formed to include a plurality holes, and wherein the holes are evenly spaced in the first photoresist pattern.

6. The method of claim 1, wherein the ALD layer includes silicon oxide or silicon nitride.

7. The method of claim 1, wherein the ALD layer is formed to have a thickness of about 0.1 nm to about 5 nm.

8. The method of claim 1, wherein forming the ALD layer is performed at a temperature of about 0° C. to about 120° C.

9. The method of claim 1, further comprising:
    forming an underlying layer on the hard mask layer,
    wherein the photoresist film is formed on the underlying layer.

10. The method of claim 1, wherein exposing the photoresist film is performed using extreme ultraviolet (EUV) light.

11. The method of claim 1, wherein etching the hard mask layer includes an anisotropic etching process.

12. The method of claim 1, further comprising performing a baking process,
    wherein the baking process includes a soft bake process after coating the photoresist film on the hard mask layer, a post-exposure bake process after exposing the photoresist film, and a post-development bake process after developing the photoresist film.

13. A method of forming a pattern of a semiconductor device, the method comprising:
    forming a hard mask layer on a substrate;
    coating a photoresist film on the hard mask layer;
    exposing and developing the photoresist film to form a first photoresist pattern;
    performing a smoothing process on the first photoresist pattern to form a second photoresist pattern having a roughness property lower than that of the first photoresist pattern, wherein a surface of the first photoresist pattern is treated with an organic solvent during the smoothing process;
    forming an atomic layer deposition (ALD) layer on a surface of the second photoresist pattern, wherein forming the ALD layer includes:
        introducing a source gas including silicon onto the substrate to be chemisorbed onto the second photoresist pattern;
        purging a non-chemisorbed source gas;
        introducing a reactant including oxygen onto the substrate to oxidize the chemisorbed source gas to form the ALD layer including silicon oxide; and
        purging an unreacted gas;
    anisotropically etching the ALD layer to form an ALD layer pattern on a sidewall of the second photoresist pattern; and
    etching the hard mask layer using the second photoresist pattern and the ALD layer pattern as an etching mask to form a hard mask pattern.

14. The method of claim 13, wherein the steps of claim 8 are performed repeatedly,
    and wherein a thickness of the ALD layer is controlled by the number of repetition of the steps of claim 13.

15. A method of forming a photoresist pattern, comprising:
    providing a substrate;
    disposing a hard mask layer on the substrate;
    disposing an underlying layer on the hard mask;
    forming a photoresist film on the underlying layer;
    exposing the photoresist film to light through a reticle to form a photoresist film pattern having a plurality of holes in portions of the photoresist film pattern exposed to light through the reticle, wherein each of the plurality of holes has side surfaces and a bottom surface, and wherein the bottom surfaces of the holes expose the underlying layer;
    performing a smoothing process on inner sidewalls of the holes;
    forming an atomic layer deposition (ALD) layer on a top surface of the photoresist film pattern, the side surfaces of the holes, and the bottom surfaces of the holes;
    etching the ALD layer to remove the ALD layer from the top surface of the photoresist film and the bottom surfaces of the holes to form an ALD pattern on the side surfaces of the holes; and
    etching the hard mask layer using the photoresist pattern to form a hard mask pattern.

16. The method of forming a photoresist pattern of claim 15, wherein the substrate further comprises an etch target layer disposed under the hard mask layer.

17. The method of forming a photoresist pattern of claim 15, further comprising treating the holes with an organic solvent during the smoothing process.

18. The method of forming a photoresist pattern of claim 15, wherein the ALD layer includes silicon oxide or silicon nitride.

19. The method of forming a photoresist pattern of claim 15, wherein the exposing the photoresist film to light includes exposing the photoresist film to extreme ultraviolet light (EUV).

* * * * *